(12) United States Patent
Song

(10) Patent No.: US 11,183,252 B2
(45) Date of Patent: Nov. 23, 2021

(54) DYNAMIC VOLTAGE SUPPLY CIRCUITS AND NONVOLATILE MEMORY DEVICES INCLUDING THE SAME

(71) Applicant: SK Hynix system ic Inc., Chungcheongbuk-do (KR)

(72) Inventor: Hyun Min Song, Sejong-si (KR)

(73) Assignee: SK Hynix system ic Inc., Chungcheongbuk-do (KR)

( * ) Notice: Subject to any disclaimer, the term of this patent is extended or adjusted under 35 U.S.C. 154(b) by 108 days.

(21) Appl. No.: 16/787,682

(22) Filed: Feb. 11, 2020

(65) Prior Publication Data

US 2020/0321062 A1     Oct. 8, 2020

(30) Foreign Application Priority Data

Apr. 5, 2019    (KR) .................. 10-2019-0040377

(51) Int. Cl.
| | | |
|---|---|---|
| *G11C 7/12* | (2006.01) | |
| *G11C 8/18* | (2006.01) | |
| *G11C 16/30* | (2006.01) | |
| *G11C 16/24* | (2006.01) | |
| *G11C 16/26* | (2006.01) | |
| *G11C 16/10* | (2006.01) | |
| *G11C 16/32* | (2006.01) | |

(52) U.S. Cl.
CPC ............. *G11C 16/30* (2013.01); *G11C 16/10* (2013.01); *G11C 16/24* (2013.01); *G11C 16/26* (2013.01); *G11C 16/32* (2013.01)

(58) Field of Classification Search
CPC .. G11C 16/26; G11C 7/08; G11C 7/22; G11C 11/56; G11C 16/04; G11C 29/028; G11C 8/04; G11C 16/0483; G11C 7/222; G11C 11/419; G11C 7/06; G11C 16/32; G11C 7/106; G11C 8/08; G11C 8/10; G11C 11/418; G11C 7/1087
See application file for complete search history.

(56) References Cited

U.S. PATENT DOCUMENTS

| | | | |
|---|---|---|---|
| 7,885,132 B2 | 2/2011 | Kubo et al. | |
| 9,053,806 B2* | 6/2015 | Kono | ............. G11C 16/26 |
| 2008/0298142 A1* | 12/2008 | Chen | ............. G11C 7/222 |
| | | | 365/194 |
| 2014/0025981 A1* | 1/2014 | Evans | ............. G06F 1/10 |
| | | | 713/501 |
| 2017/0178742 A1* | 6/2017 | Qiu | ............. G11C 17/16 |
| 2019/0287603 A1* | 9/2019 | Antonyan | ............. G11C 11/4091 |

* cited by examiner

*Primary Examiner* — Hien N Nguyen
(74) *Attorney, Agent, or Firm* — IP & T Group LLP

(57) ABSTRACT

A dynamic voltage supply circuit of a nonvolatile memory device includes a voltage amplification/output circuit and a dynamic voltage output circuit. The voltage amplification/output circuit receives a first clock signal and a second clock signal to generate a dynamic supply voltage greater than a supply voltage while the first clock signal has a "low" level. The dynamic voltage output circuit outputs the dynamic supply voltage while the first clock signal has a "low" level and outputs a ground voltage while the first clock signal has a "high" level.

20 Claims, 17 Drawing Sheets

DYNAMIC VOLTAGE SUPPLY CIRCUITS AND NONVOLATILE MEMORY DEVICES INCLUDING THE SAME

CROSS-REFERENCE TO RELATED APPLICATIONS

The present application claims priority under 35 U.S.C. 119(a) to Korean Application No. 10-2019-0040377, filed on Apr. 5, 2019, which is herein incorporated by references in its entirety.

BACKGROUND

1. Technical Field

Various embodiments of the present disclosure generally relate to nonvolatile memory devices and, more particularly, to dynamic voltage supply circuits and nonvolatile memory devices including the same.

2. Related Art

Semiconductor memory devices are typically categorized into random access memory (RAM) devices or read only memory (ROM) devices according to data volatility thereof. The RAM devices are volatile memory devices that lose their stored data when their power supplies are interrupted. In contrast, the ROM devices are nonvolatile memory devices that retain their stored data even when their power supplies are interrupted. The ROM devices may also be classified as programmable ROM (PROM) devices or mask ROM devices according to data input methods, that is, data program methods. The PROM devices may be fabricated and sold out without program and may be directly programmed by customers (i.e., users) after fabrication thereof. The mask ROM devices may be programmed during fabrication thereof using implantation masks manufactured based on data requested by users. The PROM devices may include one-time PROM (OTPROM) devices, erasable PROM (EPROM) devices and electrically erasable PROM (EEPROM) devices. Once the OTPROM devices are programmed, data in the programmed OTPROM devices cannot be changed.

NMOS transistors or PMOS transistors may be used as cell transistors of nonvolatile memory devices, for example, the OTPROM devices. When the PMOS transistors are used as the cell transistors of the nonvolatile memory devices, the PMOS cell transistors may have a turned-off state as an initial state thereof and may have a turned-on state as a program state thereof. A read operation of the PMOS cell transistors may be executed by sensing a voltage level of a bit line connected to any one selected from the PMOS cell transistors. In such a case, the voltage level of the bit line may be determined by a ratio of a resistance value of a load resistor coupled between a supply voltage line and the bit line to an equivalent resistance value of the selected PMOS cell transistor. As electronic systems become scaled down and classified into more diverse systems, more supply voltage levels have been required to operate the nonvolatile memory devices employed in the electronic systems. In particular, if the nonvolatile memory devices are embedded in portable devices, an operation range of the nonvolatile memory devices may be limited by reduction of a magnitude of the supply voltage according to power consumption of batteries of the portable devices.

SUMMARY

According to an embodiment, a dynamic voltage supply circuit includes a voltage amplification/output circuit and a dynamic voltage output circuit. The voltage amplification/output circuit receives a first clock signal and a second clock signal to generate a dynamic supply voltage greater than a supply voltage while the first clock signal has a "low" level. The dynamic voltage output circuit outputs the dynamic supply voltage while the first clock signal has a "low" level and outputs a ground voltage while the first clock signal has a "high" level.

According to another embodiment, a nonvolatile memory device includes a dynamic voltage supply circuit, a nonvolatile memory cell and a sense amplifying circuit. The dynamic voltage supply circuit configured to include a voltage amplification/output circuit and a dynamic voltage output circuit. The voltage amplification/output circuit receives a first clock signal and a second clock signal to generate a dynamic supply voltage greater than a supply voltage while the first clock signal has a "low" level. The dynamic voltage output circuit outputs the dynamic supply voltage while the first clock signal has a "low" level and outputs a ground voltage while the first clock signal has a "high" level. The nonvolatile memory cell is coupled between a bit line connected to a dynamic voltage supply line having the dynamic supply voltage and a ground voltage terminal. The sense amplifying circuit selectively outputs any one of the dynamic supply voltage and a ground voltage in response to a bit line voltage induced at the bit line.

According to another embodiment, a nonvolatile memory device includes a first terminal suitable for receiving a supply voltage, a second terminal suitable for receiving a first clock signal, a third terminal suitable for receiving a second clock signal, first and second output nodes, a first transistor coupled between the first terminal and the first output node, a second transistor coupled between the first terminal and the second output node, a first capacitor coupled between the first output node and the second terminal, a second capacitor coupled between the second output node and the third terminal, and a dynamic voltage output circuit coupled between a selected one of the first and second output nodes and a ground voltage terminal, suitable for generating a dynamic supply voltage greater than the supply voltage in response to a selected one of the first and second clock signals, the selected clock signal corresponding to an unselected one of the first and second output nodes.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION OF THE EMBODIMENTS

For the following description of embodiments, it will be understood that the terms "first" and "second" are intended to identify an element, but are not used to define the element itself or imply a particular sequence or hierarchy. In addition, when an element is referred to as being located "on," "over," "above," "under," or "beneath" another element, a relative positional relationship is indicated, regardless of the presence or absence of intervening elements. Accordingly, the terms such as "on," "over," "above," "under," "beneath," "below," and the like that are used herein are for the purpose of describing particular embodiments only and are not intended to limit the scope of the present disclosure. Further, when elements are referred to as being "connected" or "coupled" to one another, the elements may be electrically or mechanically connected or coupled directly without intervening elements or indirectly with intervening elements.

Various embodiments are directed to dynamic voltage supply circuits and nonvolatile memory devices including the same.

Figure 1:
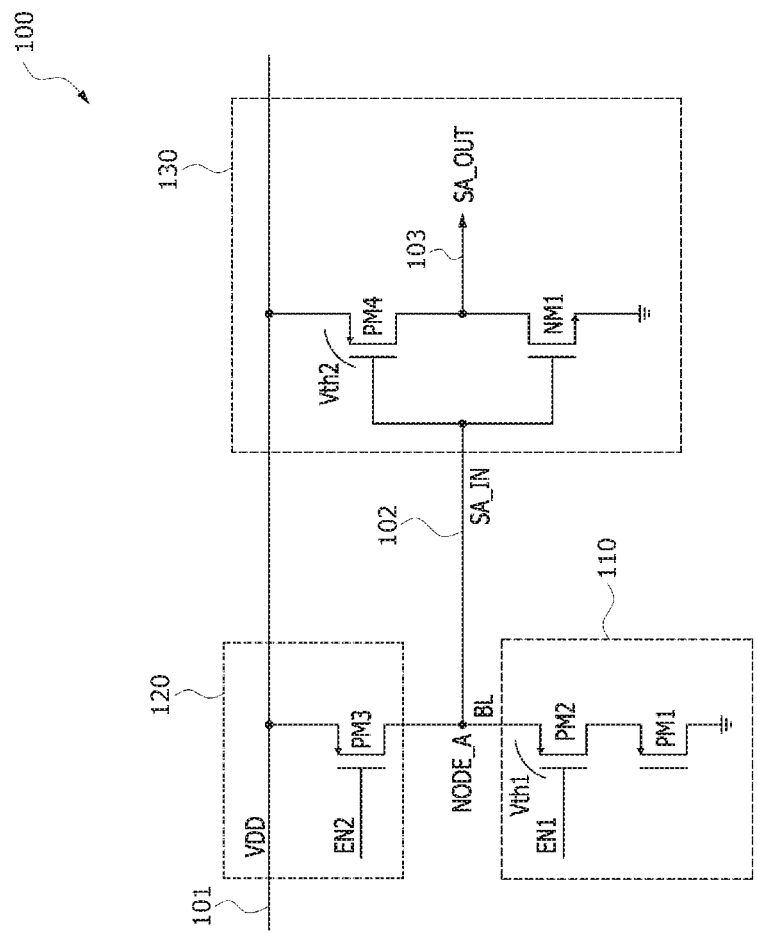
FIG. 1 is a circuit diagram illustrating a read disturbance phenomenon due to a lowered supply voltage during a read operation of a nonvolatile memory device.

FIG. 1 is a circuit diagram illustrating a read disturbance phenomenon due to a lowered supply voltage during a read operation of a nonvolatile memory device 100. Referring to FIG. 1, the nonvolatile memory device 100 may include a nonvolatile memory cell 110, a resistive load 120 and a sense amplifying circuit 130. The nonvolatile memory cell 110 may include a first PMOS transistor PM1 corresponding to a cell transistor and a second PMOS transistor PM2 corresponding to a selection transistor. A gate of the first PMOS transistor PM1 may be a floating gate, and a drain of the first PMOS transistor PM1 may be grounded. A source of the first PMOS transistor PM1 may be directly connected to a drain of the second PMOS transistor PM2. A first enable signal EN1 acting as a selection signal may be inputted to a gate of the second PMOS transistor PM2. A source of the second PMOS transistor PM2 may be coupled to a first node NODE_A through a bit line BL.

The resistive load 120 may include a resistive load device coupled between the first node NODE_A and a supply voltage line 101. The resistive load device may be, for example, a third PMOS transistor PM3. A second enable signal EN2 may be inputted to a gate of the third PMOS transistor PM3. A source and a drain of the third PMOS transistor PM3 may be coupled to the supply voltage line 101 and the first node NODE_A, respectively. When the third PMOS transistor PM3 is turned on, the third PMOS transistor PM3 may act as a resistive element coupled between the supply voltage line 101 and the first node NODE_A.

The sense amplifying circuit 130 may be realized using a complementary metal-oxide-silicon (CMOS) inverter including a first NMOS transistor NM1 and a fourth PMOS transistor PM4. A gate of the first NMOS transistor NM1 and a gate of the fourth PMOS transistor PM4 may receive a sensing input signal SA_IN through a sensing input line 102. The sensing input line 102 may be coupled to the first node NODE_A. A source of the first NMOS transistor NM1 may be grounded. A drain of the first NMOS transistor NM1 may be coupled to a drain of the fourth PMOS transistor PM4. A source of the fourth PMOS transistor PM4 may be coupled to the supply voltage line 101 to which a supply voltage VDD is applied. The drain of the first NMOS transistor NM1 and the drain of the fourth PMOS transistor PM4 may be coupled to a sensing output line 103. A sensing output signal SA_OUT may be outputted from the sense amplifying circuit 130 through the sensing output line 103.

The first PMOS transistor PM1 acting as a cell transistor may have an initial state or a program state. In the present specification, the initial state means an off-cell state that the first PMOS transistor PM1 is turned off, and the program state means an on-cell state that the first PMOS transistor PM1 is turned on. In order to read out data corresponding to a state of the first PMOS transistor PM1, the first enable signal EN1 may be applied to the gate of the second PMOS transistor PM2 to turn on the second PMOS transistor PM2 and the second enable signal EN2 may be applied to the gate of the third PMOS transistor PM3 to turn on the third PMOS transistor PM3. In such a case, a bit line voltage that is reduced by a voltage drop across the third PMOS transistor PM3, which is turned on, from the supply voltage VDD provided through the supply voltage line 101 may be applied to the first node NODE_A. The bit line voltage may correspond to the sensing input signal SA_IN. The sensing input signal SA_IN may be inputted to the sensing amplifying circuit 130.

If the first PMOS transistor PM1 has the initial state corresponding to an off-cell state, a resistance value between the first node NODE_A and a ground voltage terminal may be ideally infinite. However, a resistance value between the first node NODE_A and the ground voltage terminal may not be actually infinite but relatively too high as compared with a resistance value of the third PMOS transistor PM3 which is turned on. Thus, a voltage induced at the first node NODE_A, that is, a voltage of the sensing input signal SA_IN may be substantially equal to the supply voltage VDD. When the sensing input signal SA_IN having the supply voltage VDD is inputted to the sensing amplifying circuit 130, the fourth PMOS transistor PM4 may not be turned on whereas the first NMOS transistor NM1 is turned on. Because only the first NMOS transistor NM1 is turned on, the sensing output signal SA_OUT outputted from the sensing amplifying circuit 130 may have substantially the ground voltage. As such, if the ground voltage is generated as the sensing output signal SA_OUT, the first PMOS transistor PM1 corresponding to a cell transistor may be regarded as having the initial state.

If the first PMOS transistor PM1 has the program state corresponding to an on-cell state, a resistance value between the first node NODE_A and the ground voltage terminal may be ideally zero. However, a resistance value between the first node NODE_A and the ground voltage terminal may not be actually zero but relatively too low as compared with a resistance value of the third PMOS transistor PM3 which is turned on. Thus, a voltage induced at the first node NODE_A, that is, the sensing input voltage SA_IN may be substantially equal to the ground voltage. When the sensing input voltage SA_IN of the ground voltage is inputted to the sensing amplifying circuit 130, the first NMOS transistor NM1 may not be turned on whereas the fourth PMOS transistor PM4 is turned on. Because only the fourth PMOS transistor PM4 is turned on, the sensing output signal SA_OUT outputted from the sensing amplifying circuit 130 may have substantially the supply voltage VDD. As such, if the supply voltage VDD is generated as the sensing output signal SA_OUT, the first PMOS transistor PM1 corresponding to a cell transistor may be regarded as having the program state.

If the supply voltage VDD is lowered to have a relatively low level, the read operation of the first PMOS transistor PM1 may be abnormally performed. Specifically, in order for the first PMOS transistor PM1 to be regarded as having the program state, both of the second PMOS transistor PM2 acting as a selection transistor of the nonvolatile memory cell 110 and the fourth PMOS transistor PM4 of the sense amplifying circuit 130 have to be turned on. In order to turn on the second PMOS transistor PM2, a voltage applied between the gate and the source of the second PMOS transistor PM2 has to be greater than a first threshold voltage Vth1 between the gate and the source of the second PMOS transistor PM2. Similarly, in order to turn on the fourth PMOS transistor PM4, a voltage applied between the gate and the source of the fourth PMOS transistor PM4 has to be greater than a second threshold voltage Vth2 between the gate and the source of the fourth PMOS transistor PM4. Thus, in order to turn on both of the second and fourth PMOS transistors PM2 and PM4, the supply voltage VDD has to be greater than a sum of the first threshold voltage Vth1 of the second PMOS transistor PM2 and the second threshold voltage Vth2 of the fourth PMOS transistor PM4 when a voltage drop across the third PMOS transistor PM3 is neglected. That is, if the supply voltage VDD is less than a sum of the first threshold voltage Vth1 and the second threshold voltage Vth2, the read operation of the first PMOS transistor PM1 having the program state may be incorrectly performed.

Figure 2:
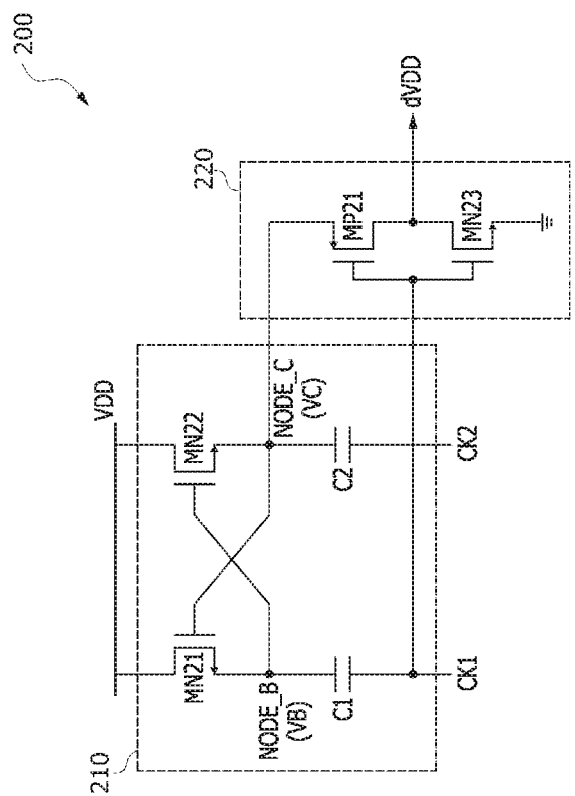
FIG. 2 is a circuit diagram illustrating a dynamic voltage supply circuit of a nonvolatile memory device according to an embodiment of the present disclosure.

FIG. 2 is a circuit diagram illustrating a dynamic voltage supply circuit 200 employed in a nonvolatile memory device according to an embodiment of the present disclosure. Referring to FIG. 2, the dynamic voltage supply circuit 200 may include a voltage amplification and output (amplification/output) circuit 210 and a dynamic voltage output circuit 220. The voltage amplification/output circuit 210 may receive a first clock signal CK1 and a second clock signal CK2 to generate a dynamic supply voltage dVDD which is twice greater than the supply voltage VDD while the first clock signal CK1 has a voltage corresponding to a "low" level. The dynamic voltage output circuit 220 may output the dynamic supply voltage dVDD while the first clock signal CK1 has a voltage corresponding to a "low" level and may output the ground voltage (i.e., 0 volt) while the first clock signal CK1 has a voltage corresponding to a "high" level.

Specifically, the voltage amplification/output circuit 210 may be configured to include a first capacitor C1, a second capacitor C2, a first NMOS transistor MN21 and a second NMOS transistor MN22. The first clock signal CK1 may be applied to one end of the first capacitor C1, and the other end of the first capacitor C1 may be coupled to a first node NODE_B. Thus, if the first clock signal CK1 having the supply voltage VDD is applied to one end of the first capacitor C1, a first node voltage VB induced at the first node NODE_B may be boosted up to the supply voltage VDD. The second clock signal CK2 may be applied to one end of the second capacitor C2, and the other end of the second capacitor C2 may be coupled to a second node NODE_C. Thus, if the second clock signal CK2 having the supply voltage VDD is applied to one end of the second capacitor C2, a second node voltage VC induced at the second node NODE_C may be boosted up to the supply voltage VDD.

The first NMOS transistor MN21 may be coupled between a terminal of the supply voltage VDD and the first node NODE_B. A gate of the first NMOS transistor MN21 may be coupled to the second node NODE_C. A drain and a source of the first NMOS transistor MN21 may be coupled to the terminal of the supply voltage VDD and the first node NODE_B, respectively. Thus, if a gate-to-source voltage Vgs (i.e., a voltage value calculated by an equation "VC−VB") of the first NMOS transistor MN21 is greater than a threshold voltage of the first NMOS transistor MN21, the first NMOS transistor MN21 may be turned on. The second NMOS transistor MN22 may be coupled between the terminal of the supply voltage VDD and the second node NODE_C. A gate of the second NMOS transistor MN22 may be coupled to the first node NODE_B. A drain and a source of the second NMOS transistor MN22 may be coupled to the terminal of the supply voltage VDD and the second node NODE_C, respectively. Thus, if a gate-to-source voltage Vgs (i.e., a voltage value "VB minus VC") of the second NMOS transistor MN22 is greater than a threshold voltage of the second NMOS transistor MN22, the second NMOS transistor MN22 may be turned on.

The dynamic voltage output circuit 220 may be realized using an inverter. In such a case, the dynamic voltage output circuit 220 may be configured to include a first PMOS transistor MP21 and a third NMOS transistor MN23. The first PMOS transistor MP21 may be coupled between the second node NODE_C and an output line of a dynamic supply voltage dVDD. The first clock signal CK1 may be applied to a gate of the first PMOS transistor MP21. A source and a drain of the first PMOS transistor MP21 may be coupled to the second node NODE_C and the output line of the dynamic supply voltage dVDD, respectively. The third NMOS transistor MN23 may be coupled between the output line of the dynamic supply voltage dVDD and the ground voltage terminal. The first clock signal CK1 may be applied to a gate of the third NMOS transistor MN23. A drain and a source of the third NMOS transistor MN23 may be coupled to the output line of the dynamic supply voltage dVDD and the ground voltage terminal.

When the first clock signal CK1 has a "high" level, for example, the supply voltage VDD, the first PMOS transistor MP21 may be turned off and the third NMOS transistor MN23 may be turned on. Thus, the dynamic supply voltage dVDD having the ground voltage may be outputted through the output line of the dynamic supply voltage dVDD. In contrast, when the first clock signal CK1 has a "low" level, for example, the ground voltage, the first PMOS transistor MP21 may be turned on and the third NMOS transistor MN23 may be turned off. Thus, the dynamic supply voltage dVDD outputted through the output line of the dynamic supply voltage dVDD may have the second node voltage VC.

Figure 3:
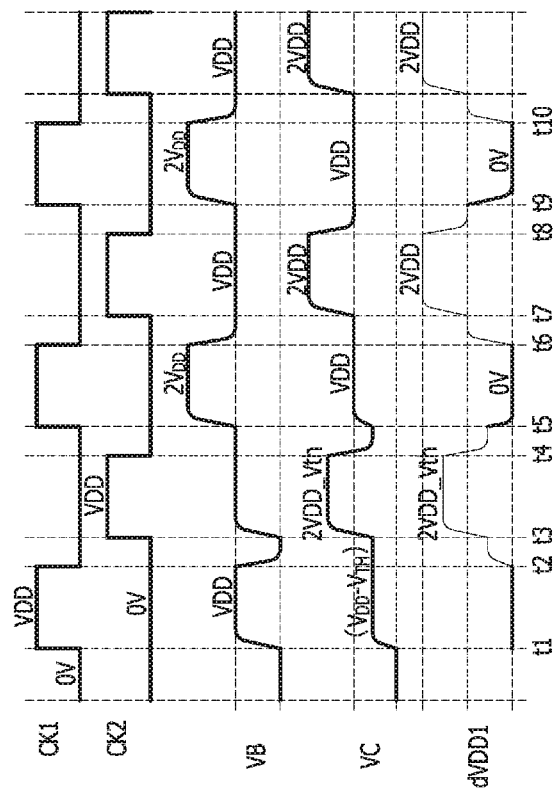
FIG. 3 is a timing diagram illustrating an operation of a dynamic voltage supply circuit according to an embodiment of the present disclosure.

FIG. 3 is a timing diagram illustrating an operation of a dynamic voltage supply circuit according to an embodiment of the present disclosure, for example, the dynamic voltage supply circuit 200 shown in FIG. 2. FIGS. 4 to 12 are circuit diagrams illustrating operations of the dynamic voltage supply circuit 200 shown in FIG. 2 according to points in time of the timing diagram of FIG. 3. First, as illustrated in FIG. 3, a "high" level of the first and second clock signals CK1 and CK2 means the supply voltage VDD and a "low" level of the first and second clock signals CK1 and CK2 means the ground voltage. In the present embodiment, the first and second clock signals CK1 and CK2 may be provided such that "high" level periods of the first clock signal CK1 do not overlap with "high" level periods of the second clock signal CK2 in a timing diagram. In addition, the first and second clock signals CK1 and CK2 may be provided such that the "high" level periods of the first clock signal CK1 and the "high" level periods of the second clock signal CK2 are alternately generated. For example, during a period from a first point in time "t1" till a second point in time "t2", the second clock signal CK2 may have the ground voltage whereas the first clock signal CK1 has the supply voltage VDD. Moreover, during a period from a third point in time "t3" till a fourth point in time "t4", the second clock signal CK2 may have the supply voltage VDD whereas the first clock signal CK1 has the ground voltage. Furthermore, the second clock signal CK2 may have the ground voltage whereas the first clock signal CK1 has the supply voltage VDD during a period from a fifth point in time "t5" till a sixth point in time "t6", and the second clock signal CK2 may have the supply voltage VDD whereas the first clock signal CK1 has the ground voltage during a period from a seventh point in time "t7" till an eighth point in time "t8". In addition, the second clock signal CK2 may have the ground voltage whereas the first clock signal CK1 has the supply voltage VDD during a period from a ninth point in time "t9" till a tenth point in time "t10".

Figure 4:
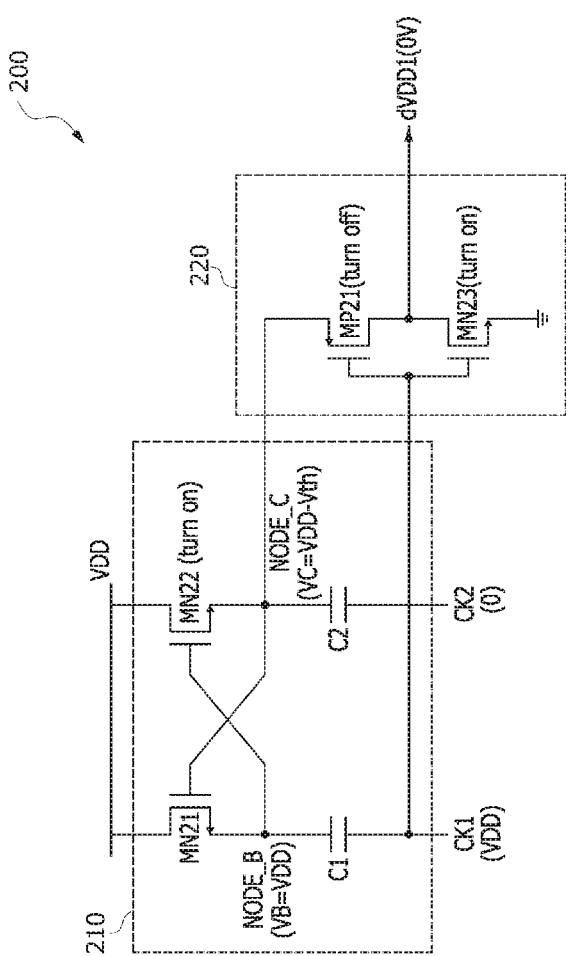
FIGS. 4 to 12 are circuit diagrams illustrating operations of the dynamic voltage supply circuit shown in FIG. 2 according to points in time of the timing diagram of FIG. 3.

As illustrated in FIG. 4, during the period from the first point in time "t1" till the second point in time "t2", the first clock signal CK1 may have the supply voltage VDD corresponding to a "high" level and the second clock signal CK2 may have the ground voltage corresponding to a "low" level. Accordingly, the first node voltage VB may be boosted up to the supply voltage VDD as a level of the first clock signal CK1 changes from the ground voltage into the supply voltage VDD. As the first node voltage VB is boosted up to the supply voltage VDD, the second NMOS transistor MN22 may be turned on. The second node voltage VC may be boosted from the ground voltage to reach a voltage level "VDD−Vth" that remains after subtracting a threshold voltage Vth of the second NMOS transistor MN22 from the supply voltage VDD. Because the first clock signal CK1 has the supply voltage VDD, the first PMOS transistor MP1 may be turned off and the third NMOS transistor MN23 may be turned on. Accordingly, a dynamic supply voltage dVDD1 having the ground voltage may be outputted from the dynamic voltage supply circuit 200.

Figure 5:
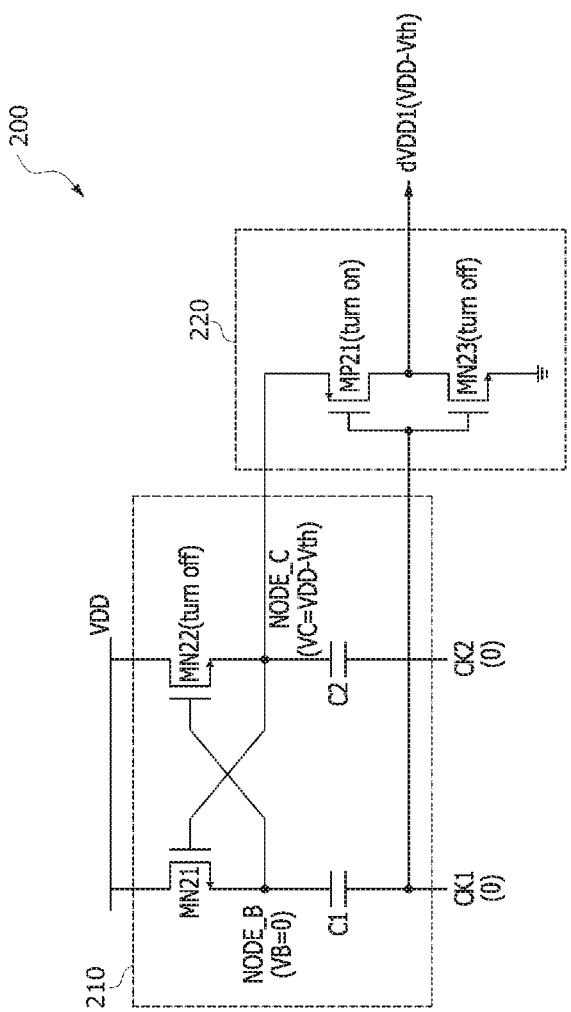

As illustrated in FIG. 5, during a period from the second point in time "t2" till the third point in time "t3", both of the first and second clock signals CK1 and CK2 have the ground voltage corresponding to a "low" level and the first node voltage VB may be lowered from the supply voltage VDD to the ground voltage as a level of the first clock signal CK1 changes from the supply voltage VDD to the ground voltage. As the first node voltage VB is lowered from the supply voltage VDD to the ground voltage, the second NMOS transistor MN22 may be turned off. The second node voltage VC may maintain the previous voltage level "VDD−Vth". Because the first clock signal CK1 has the ground voltage, the first PMOS transistor MP21 may be turned on and the third NMOS transistor MN23 may be turned off. Thus, the dynamic supply voltage dVDD1 outputted from the dynamic voltage supply circuit 200 may have a voltage level "VDD−Vth" that remains after subtracting a threshold voltage Vth of the second NMOS transistor MN22 from the supply voltage VDD corresponding to the second node voltage VC.

Figure 6:
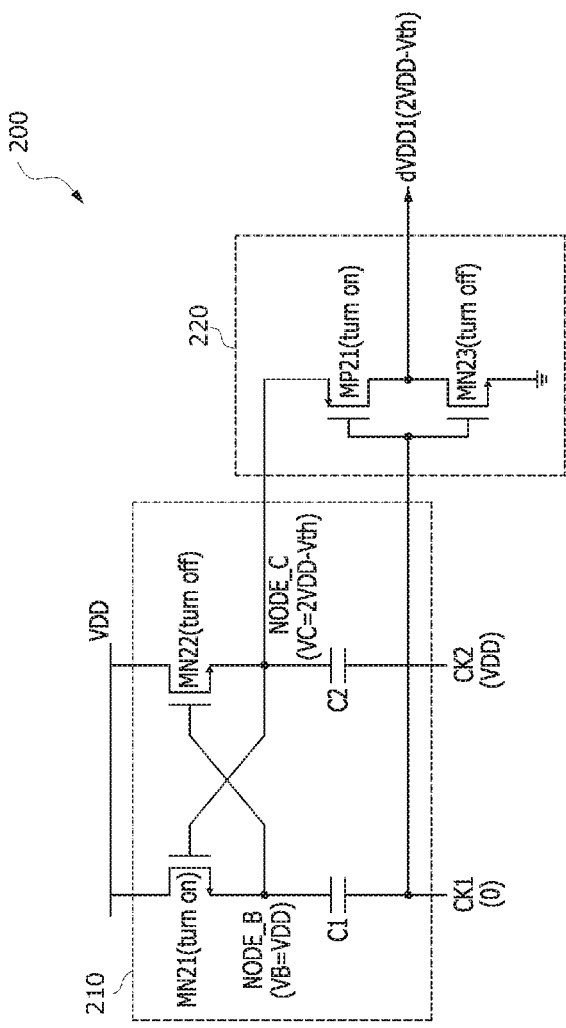

As illustrated in FIG. 6, during the period from the third point in time "t3" till the fourth point in time "t4", the first clock signal CK1 may have the ground voltage corresponding to a "low" level and the second clock signal CK2 may have the supply voltage VDD corresponding to a "high" level. Accordingly, as a level of the second clock signal CK2 changes from the ground voltage into the supply voltage VDD, the second node voltage VC may be boosted by the supply voltage VDD from the previous voltage "VDD−Vth" to reach a voltage level "2×VDD−Vth" that remains after subtracting a threshold voltage Vth of the second NMOS transistor MN22 from twice the supply voltage VDD. As the second node voltage VC is boosted, the first NMOS transistor MN21 may be turned on. If the first NMOS transistor MN21 is turned on, the first node voltage VB may be boosted up to the supply voltage VDD. In such a case, the second NMOS transistor MN22 may still be turned off because the first node voltage VB has the supply voltage VDD. Since the first clock signal CK1 has the ground voltage, the first PMOS transistor MP21 may be turned on and the third NMOS transistor MN23 may be turned off. As a result, the dynamic supply voltage dVDD1 outputted from the dynamic voltage supply circuit 200 may have a voltage level "2×VDD−Vth" that remains after subtracting a threshold voltage Vth of the second NMOS transistor MN22 from twice the supply voltage VDD.

Figure 7:
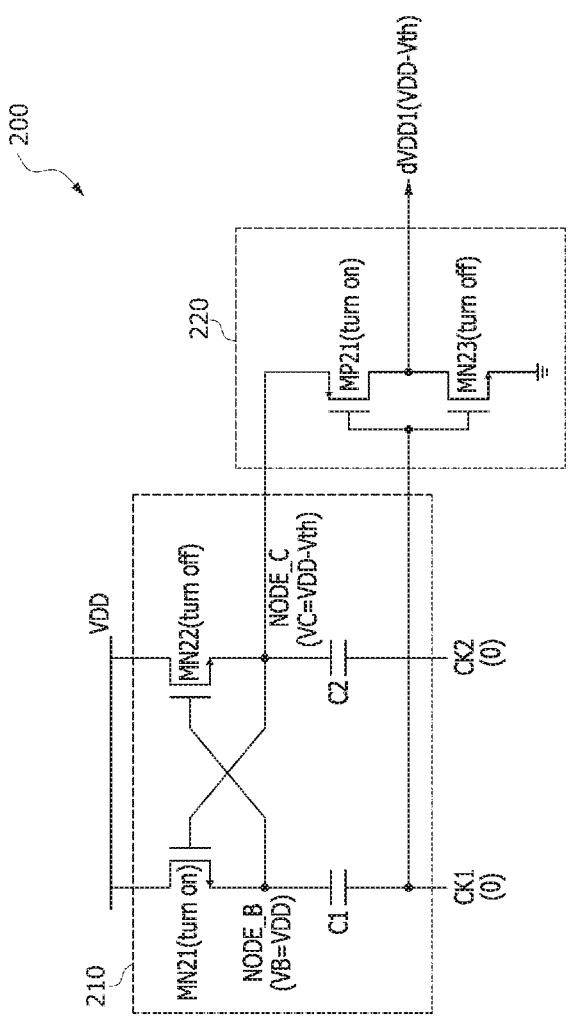

As illustrated in FIG. 7, during a period from the fourth point in time "t4" till the fifth point in time "t5", both of the first and second clock signals CK1 and CK2 have the ground voltage corresponding to a "low" level. In such a case, as the second clock signal CK2 changes from the supply voltage VDD into the ground voltage, the second node voltage VC may be lowered to have a voltage level "VDD−Vth" that remains after subtracting a threshold voltage Vth of the second NMOS transistor MN22 from the supply voltage VDD. Because the first clock signal CK1 has the ground voltage, the first PMOS transistor MP21 may be turned on and the third NMOS transistor MN23 may be turned off. Thus, the dynamic supply voltage dVDD1 outputted from the dynamic voltage supply circuit 200 may have a voltage level "VDD−Vth" that remains after subtracting a threshold voltage Vth of the second NMOS transistor MN22 from the supply voltage VDD corresponding to the second node voltage VC.

Figure 8:
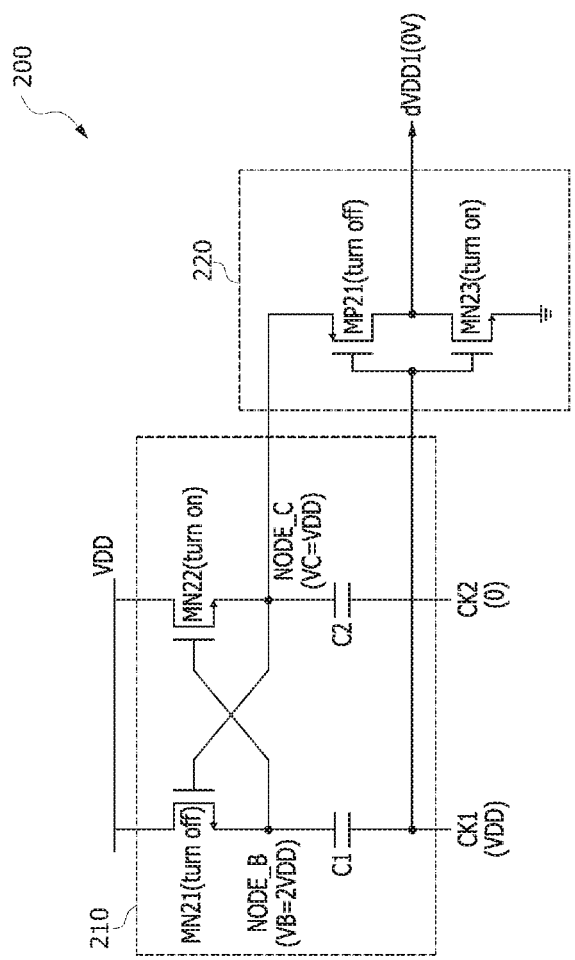

As illustrated in FIG. 8, during the period from the fifth point in time "t5" till the sixth point in time "t6", the first clock signal CK1 may have the supply voltage VDD corresponding to a "high" level and the second clock signal CK2 may have the ground voltage corresponding to a "low" level. Accordingly, as a level of the first clock signal CK1 changes from the ground voltage into the supply voltage VDD, the first node voltage VB may be boosted to reach a voltage level of "2×VDD". As the first node voltage VB is boosted up to a voltage level of "2×VDD", the first NMOS transistor MN21 may be turned off and the second NMOS transistor MN22 may be turned on. The first node voltage VB may maintain the voltage level of "2×VDD" because the first NMOS transistor MN21 is turned off, and the second node voltage VC may be boosted up to reach the supply voltage VDD. Since the first clock signal CK1 has the supply voltage VDD, the first PMOS transistor MP21 may be turned off and the third NMOS transistor MN23 may be turned on. As a result, the dynamic supply voltage dVDD1 outputted from the dynamic voltage supply circuit 200 may have the ground voltage (i.e., zero volt).

Figure 9:
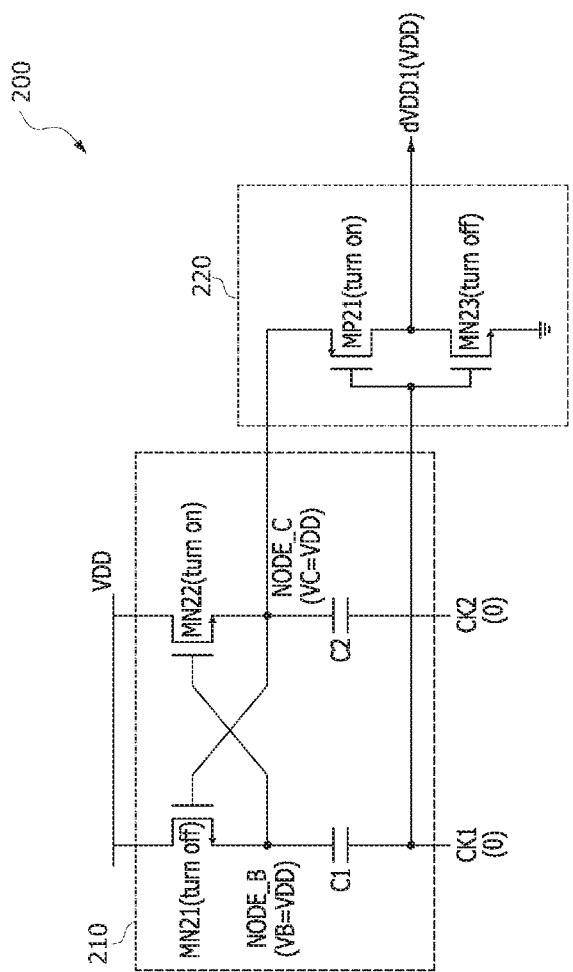

As illustrated in FIG. 9, during a period from the sixth point in time "t6" till the seventh point in time "t7", both of the first and second clock signals CK1 and CK2 have the ground voltage corresponding to a "low" level. In such a case, as the first clock signal CK1 changes from the supply voltage VDD into the ground voltage, the first node voltage VB may be lowered from the voltage level of "2×VDD" to the supply voltage VDD. The second node voltage VC may maintain the previous voltage level (i.e., the supply voltage VDD). Since the first clock signal CK1 has the ground voltage, the first PMOS transistor MP21 may be turned on and the third NMOS transistor MN23 may be turned off. Thus, the dynamic supply voltage dVDD1 outputted from the dynamic voltage supply circuit 200 may have the supply voltage VDD.

Figure 10:
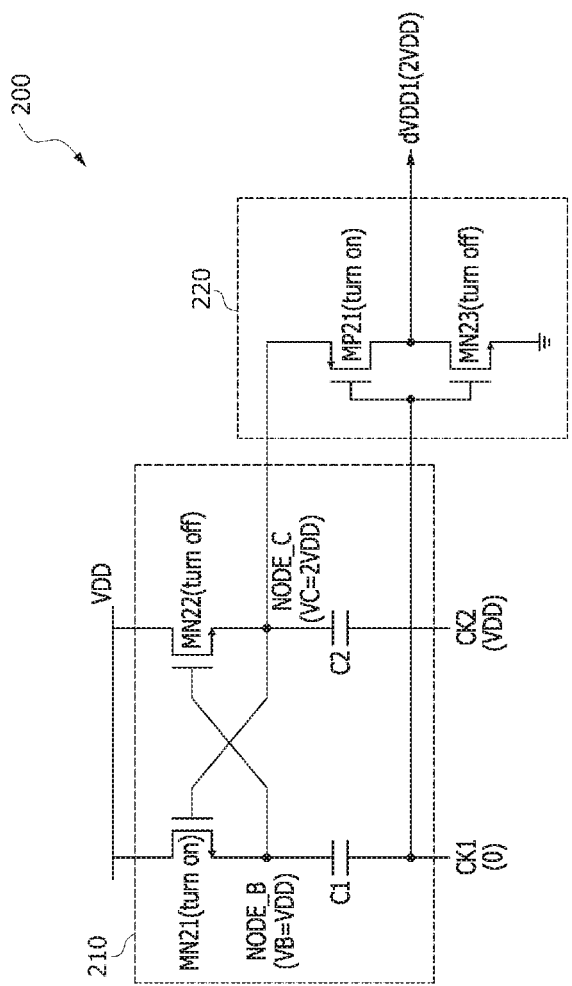

As illustrated in FIG. 10, during the period from the seventh point in time "t7" till the eighth point in time "t8", the first clock signal CK1 may have the ground voltage corresponding to a "low" level and the second clock signal CK2 may have the supply voltage VDD corresponding to a "high" level. Accordingly, as a level of the second clock signal CK2 changes from the ground voltage into the supply voltage VDD, the second node voltage VC may be boosted by the supply voltage VDD from the supply voltage VDD to reach a voltage level of "2×VDD". As the second node voltage VC is boosted up to have a voltage level of "2×VDD", the first NMOS transistor MN21 may be turned on. As the first NMOS transistor MN21 is turned on, the first node voltage VB may maintain the supply voltage VDD. In such a case, because the first node voltage VB has a voltage level of the supply voltage VDD and the second node voltage VC has a voltage level of "2×VDD", the second NMOS transistor MN22 may be turned off to maintain the second node voltage VC having the voltage level of "2×VDD". Since the first clock signal CK1 has the ground voltage, the first PMOS transistor MP21 may be turned on and the third NMOS transistor MN23 may be turned off. As a result, the dynamic supply voltage dVDD1 outputted from the dynamic voltage supply circuit 200 may have a voltage level of "2×VDD" corresponding to the second node voltage VC.

Figure 11:
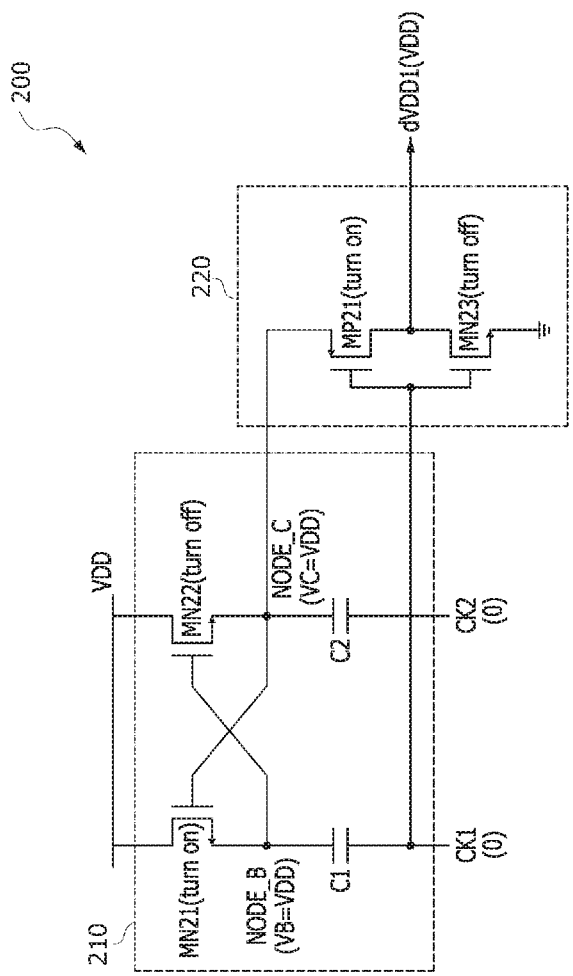

As illustrated in FIG. 11, during a period from the eighth point in time "t8" till the ninth point in time "t9", both of the first and second clock signals CK1 and CK2 have the ground voltage corresponding to a "low" level. In such a case, as the second clock signal CK2 changes from the supply voltage VDD into the ground voltage, the second node voltage VC may be lowered to the supply voltage VDD from the voltage level of "2×VDD". Because the first clock signal CK1 has the ground voltage, the first PMOS transistor MP21 may be turned on and the third NMOS transistor MN23 may be turned off. Thus, the dynamic supply voltage dVDD1 outputted from the dynamic voltage supply circuit 200 may have the supply voltage VDD corresponding the second node voltage VC.

Figure 12:
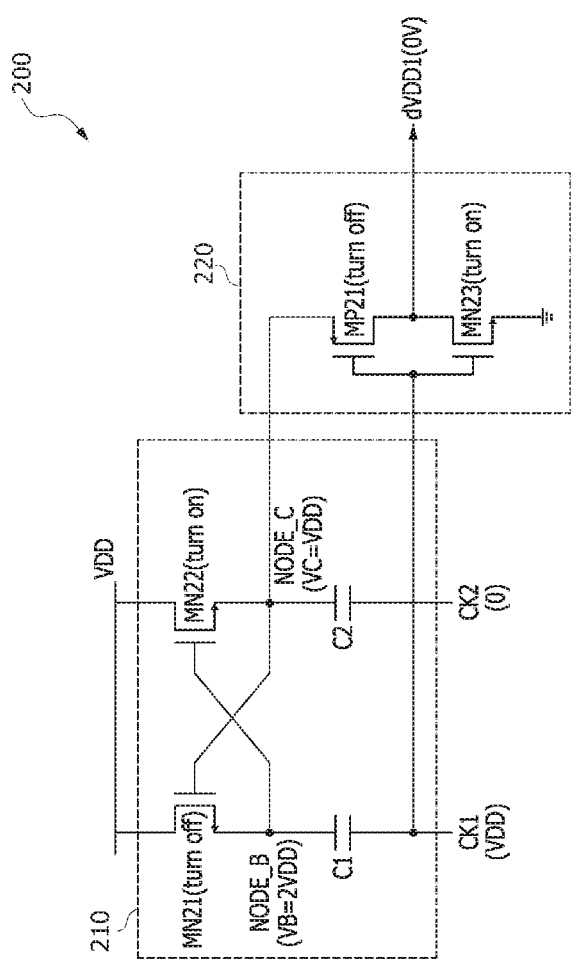

As illustrated in FIG. 12, during the period from the ninth point in time "t9" till the tenth point in time "t10", the first clock signal CK1 may have the supply voltage VDD corresponding to a "high" level and the second clock signal CK2 may have the ground voltage corresponding to a "low" level. Accordingly, as a level of the first clock signal CK1 changes from the ground voltage into the supply voltage VDD, the first node voltage VB may be boosted to reach a voltage level of "2×VDD". As the first node voltage VB is boosted up to a voltage level of "2×VDD", the first NMOS transistor MN21 may be turned off and the second NMOS transistor MN22 may be turned on. The first node voltage VB may maintain the voltage level of "2×VDD" because the first NMOS transistor MN21 is turned off, and the second node voltage VC may maintain the supply voltage VDD because the second NMOS transistor MN22 is turned on. Since the first clock signal CK1 has the supply voltage VDD, the first PMOS transistor MP21 may be turned off and the third NMOS transistor MN23 may be turned on. As a result, the dynamic supply voltage dVDD1 outputted from the dynamic voltage supply circuit 200 may have the ground voltage (i.e., zero volt).

Subsequently, the operations described with reference to FIG. 7 to 12 may be repeatedly performed. Thus, from a second duration "t6-t9" among durations "t2-t5" and "t6-t9", in which the first clock signal CK1 has a "low" level, the dynamic supply voltage dVDD1 may be boosted from the ground voltage to a double supply voltage "2×VDD" to maintain the double supply voltage "2×VDD" for a certain duration (e.g., while the second clock signal CK2 has a "high" level) and may then be lowered to have the supply voltage VDD. In contrast, for durations "t1-t2", "t5-t6" and "t9-t10", in which the first clock signal CK1 has a "high" level, the dynamic supply voltage dVDD1 outputted from the dynamic voltage supply circuit 200 may have the ground voltage (i.e., zero volt).

Figure 13:
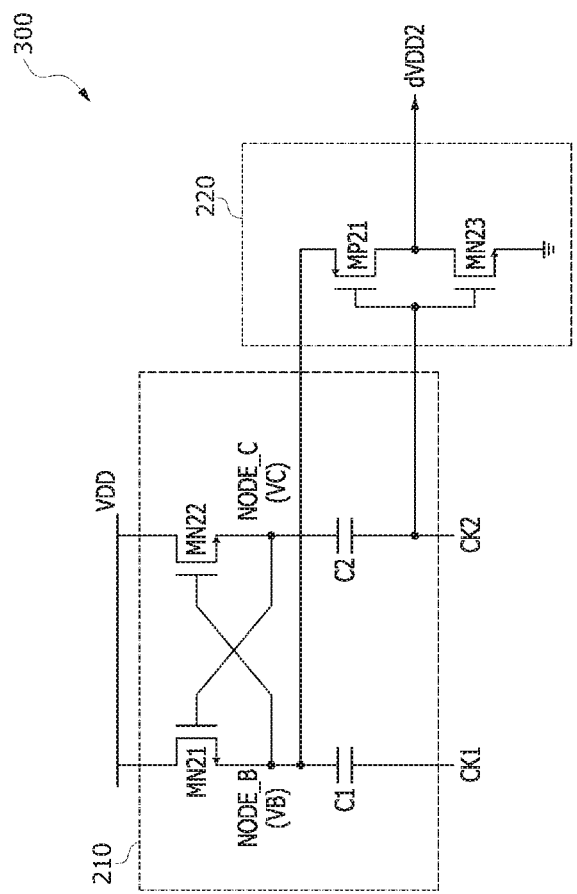
FIG. 13 is a circuit diagram illustrating a dynamic voltage supply circuit of a nonvolatile memory device according to an embodiment of the present disclosure.

FIG. 13 is a circuit diagram illustrating a dynamic voltage supply circuit 300 of a nonvolatile memory device according to an embodiment of the present disclosure. In FIG. 13, the same reference numerals or symbols as used in FIG. 2 denote the same elements. Referring to FIG. 13, the dynamic voltage supply circuit 300 may be different from the dynamic voltage supply circuit 200 in terms of a connection structure between the voltage amplification/output circuit 210 and the dynamic voltage output circuit 220. Specifically, the gate of the first PMOS transistor MP21 and the gate of the third NMOS transistor MN23 of the dynamic voltage supply circuit 300 may be coupled to one terminal of the second capacitor C2, to which the second clock signal CK2 is inputted. In addition, the source of the first PMOS transistor MP21 of the dynamic voltage supply circuit 300 may be coupled to the first node NODE_B. As a result, a dynamic supply voltage dVDD2 outputted from the dynamic voltage supply circuit 300 may have the first node voltage VB when the second clock signal CK2 has a "low" level and may have the ground voltage (i.e., zero volt) when the second clock signal CK2 has a "high" level.

Figure 14:
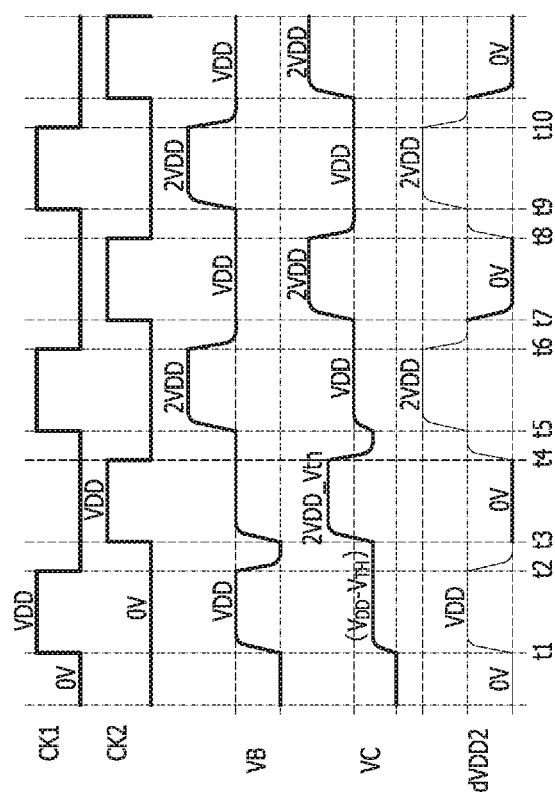
FIG. 14 is a timing diagram illustrating an operation of a dynamic voltage supply circuit according to an embodiment of the present disclosure.

FIG. 14 is a timing diagram illustrating an operation of the dynamic voltage supply circuit 300 shown in FIG. 13. Referring to FIG. 14, the first and second node voltages VB and VC of the dynamic voltage supply circuit 300 may have the same wave forms as described with reference to FIGS. 4 to 12. However, an output timing of the dynamic supply voltage dVDD2 having the double supply voltage "2×VDD" may be different from an output timing of the dynamic supply voltage dVDD1 having the double supply voltage "2×VDD". Specifically, because the dynamic supply voltage dVDD2 has the first node voltage VB while the second clock signal CK2 has a "low" level (i.e., the ground voltage), the dynamic supply voltage dVDD2 outputted from the dynamic voltage supply circuit 300 may have the supply voltage VDD during a period from the point in time "t1" till the point in time "t3" (i.e., for a first duration that the second clock signal CK2 has a "low" level). However, the dynamic supply voltage dVDD2 outputted from the dynamic voltage supply circuit 300 may have the double supply voltage "2×VDD" during a period from the point in time "t4" till the point in time "t7" (i.e., for a second duration that the second clock signal CK2 has a "low" level). After the point in time "t7", the dynamic supply voltage dVDD2 outputted from the dynamic voltage supply circuit 300 may have the double supply voltage "2×VDD" whenever the second clock signal CK2 has a "low" level.

Figure 15:
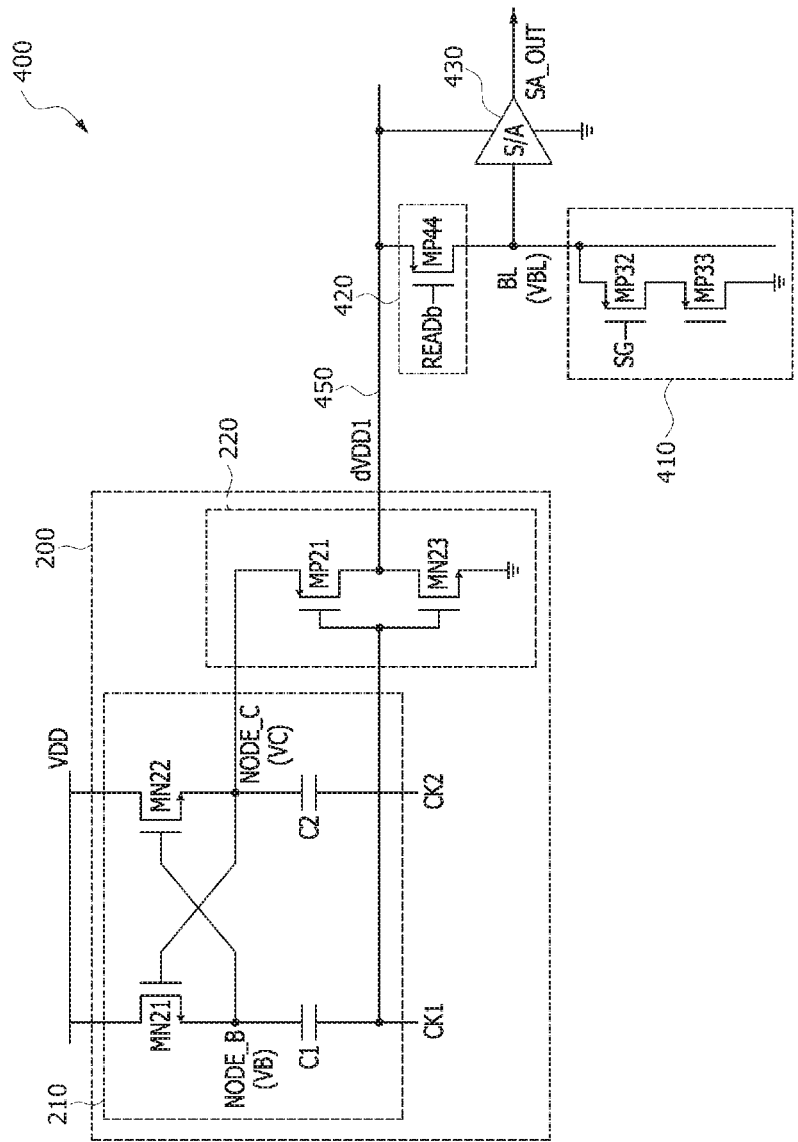
FIG. 15 is a circuit diagram illustrating a nonvolatile memory device according to an embodiment of the present disclosure.
Figure 16:
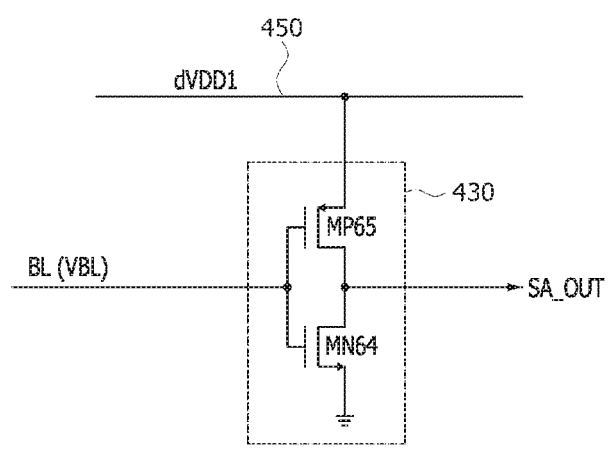
FIG. 16 is a circuit diagram illustrating a sense amplifying circuit in a nonvolatile memory device according to an embodiment of the present disclosure.

FIG. 15 is a circuit diagram illustrating an example of a nonvolatile memory device 400 according to an embodiment of the present disclosure. FIG. 16 is a circuit diagram illustrating an example of a sense amplifying circuit 430 included in the nonvolatile memory device 400 of FIG. 15. Referring to FIG. 15, the nonvolatile memory device 400 may be configured to include the dynamic voltage supply circuit 200, a nonvolatile memory cell 410, a resistive load 420 and a sense amplifying circuit 430. The dynamic voltage supply circuit 200 may have the same configuration as described with reference to FIGS. 2 and 3. The nonvolatile memory cell 410 may be configured to include a second PMOS transistor MP32 acting as a selection transistor and a third PMOS transistor MP33 acting as a cell transistor. A selection signal SG may be inputted to a gate of the second PMOS transistor MP32. A source of the second PMOS transistor MP32 may be coupled to a bit line BL, and a drain of the second PMOS transistor MP32 may be coupled to a source of the third PMOS transistor MP33. A gate of the third PMOS transistor MP33 may be a floating gate, and a drain of the third PMOS transistor MP33 may be grounded.

The resistive load 420 may include a resistive load device coupled between a dynamic voltage supply line 450 and the bit line BL. In an embodiment, the resistive load 420 may be a fourth PMOS transistor MP44. A read signal READb may be inputted to a gate of the fourth PMOS transistor MP44. A drain of the fourth PMOS transistor MP44 may be coupled to the bit line BL, and a source of the fourth PMOS transistor MP44 may be coupled to the dynamic voltage supply line 450. In the present embodiment, the dynamic voltage supply line 450 may be defined as a signal line to which an output signal (i.e., the dynamic supply voltage dVDD1) of the dynamic voltage supply circuit 200 is applied. If the fourth PMOS transistor MP44 constituting the resistive load 420 is turned on, the fourth PMOS transistor MP44 may act as a resistor coupled between the dynamic voltage supply line 450 and the bit line BL.

The sense amplifying circuit 430 may receive a bit line voltage VBL through the bit line BL and may output the dynamic supply voltage dVDD1 or the ground voltage induced at the dynamic voltage supply line 450 as the sensing output signal SA_OUT. As illustrated in FIG. 16, according to an embodiment, the sense amplifying circuit 430 may be realized using an inverter. In such a case, the sense amplifying circuit 430 may be configured to include a fifth PMOS transistor MP65 and a fourth NMOS transistor MN64 which are coupled in series. The fifth PMOS transistor MP65 may be coupled between the dynamic voltage supply line 450 and a sensing output signal line through which the sensing output signal SA_OUT is outputted. A gate of the fifth PMOS transistor MP65 may be coupled to the bit line BL. A source and a drain of the fifth PMOS transistor MP65 may be coupled to the dynamic voltage supply line 450 and the sensing output signal line, respectively. The fourth NMOS transistor MN64 may be coupled between the sensing output signal line and the ground voltage terminal. A gate of the fourth NMOS transistor MN64 may be coupled to the bit line BL. A drain and a source of the fourth NMOS transistor MN64 may be coupled to the sensing output signal line and the ground voltage terminal, respectively.

If the bit line voltage VBL has a "high" level, the fifth PMOS transistor MP65 may be turned off and the fourth NMOS transistor MN64 may be turned on. Thus, the sensing output signal SA_OUT outputted through the sensing output signal line may have the ground voltage. In contrast, if the bit line voltage VBL has a "low" level, the fifth PMOS transistor MP65 may be turned on and the fourth NMOS transistor MN64 may be turned off. Thus, the sensing output signal SA_OUT outputted through the sensing output signal line may have the dynamic supply voltage dVDD1 applied to the dynamic voltage supply line 450.

Referring again to FIG. 15, a read operation of the nonvolatile memory cell 410 may be performed in response to the read signal READb. That is, in order to perform the read operation of the nonvolatile memory cell 410, the read signal READb having a "low" level may be applied to the gate of the fourth PMOS transistor MP44 and the selection signal SG having a "low" level may be applied to the gate of the second PMOS transistor MP32. The selection signal SG may be generated to be synchronized with the read signal READb. Both of the second PMOS transistor MP32 and the fourth PMOS transistor MP44 may be turned on by the read signal READb and the selection signal SG which have a "low" level. Thus, the bit line voltage VBL induced at the bit line BL may be determined according to whether the third PMOS transistor MP33 acting as a nonvolatile memory cell has an on-cell state or an off-cell state.

If the third PMOS transistor MP33 has an on-cell state corresponding to the program state, the bit line voltage VBL induced at the bit line BL may have the ground voltage corresponding to a "low" level. Accordingly, as described with reference to FIG. 16, the sense amplifying circuit 430 may output the dynamic supply voltage dVDD1 applied to the dynamic voltage supply line 450 as the sensing output signal SA_OUT. That is, if the sensing output signal SA_OUT outputted from the sense amplifying circuit 430 has the dynamic supply voltage dVDD1, the third PMOS transistor MP33 acting as a nonvolatile memory cell may be regarded as a program cell. On the contrary, if the third PMOS transistor MP33 has an off-cell state corresponding to the initial state, the bit line voltage VBL induced at the bit line BL may have the dynamic supply voltage dVDD1 corresponding to a "high" level. Accordingly, as described with reference to FIG. 16, the sense amplifying circuit 430 may output the ground voltage as the sensing output signal SA_OUT. That is, if the sensing output signal SA_OUT outputted from the sense amplifying circuit 430 has the ground voltage, the third PMOS transistor MP33 acting as a nonvolatile memory cell may be regarded as a non-program cell having the initial state.

In the nonvolatile memory device 400, a "low" level period of the read signal READb may be synchronized with "low" level periods of the first clock signal CK1 after a first "low" level period of the first clock signal CK1 elapses. In such a case, as described with reference to FIGS. 2 and 3, the dynamic supply voltage dVDD1 loaded on the dynamic voltage supply line 450 may have the double supply voltage "2×VDD". Thus, if the third PMOS transistor MP33 has the program state, the second PMOS transistor MP32 of the nonvolatile memory cell 410 and the fifth PMOS transistor MP65 of the sense amplifying circuit 430 have to be fully turned on during the read operation. According to the present embodiment, because the dynamic supply voltage dVDD1 having the double supply voltage "2×VDD" is applied to the second PMOS transistor MP32 of the nonvolatile memory cell 410 and the fifth PMOS transistor MP65 of the sense amplifying circuit 430, it may be possible to suppress the read disturbance phenomenon occurring due to a low supply voltage, which is less than a sum of a threshold voltage of the second PMOS transistor MP32 and a threshold voltage of the fifth PMOS transistor MP65 during the read operation.

Figure 17:
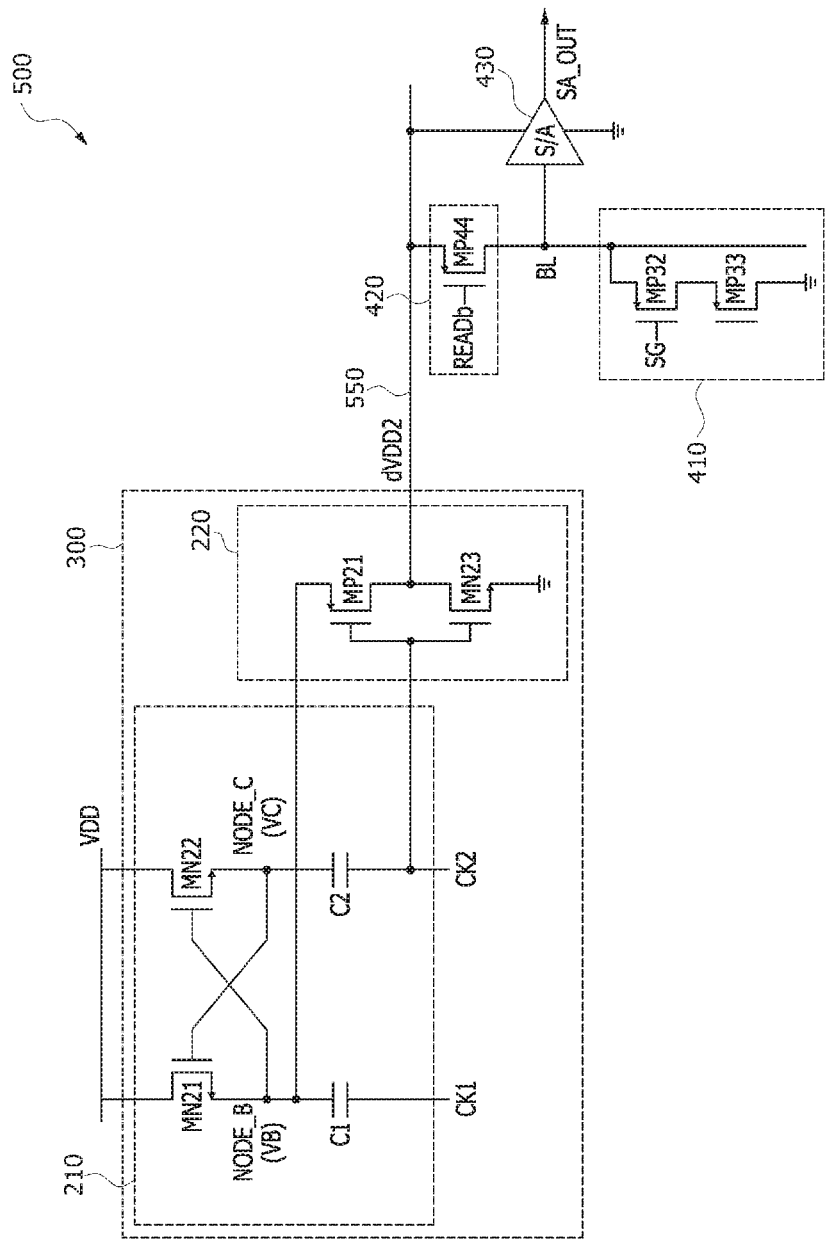
FIG. 17 is a circuit diagram illustrating a nonvolatile memory device according to an embodiment of the present disclosure.

FIG. 17 is a circuit diagram illustrating a nonvolatile memory device 500 according to another embodiment of the present disclosure. Referring to FIG. 17, the nonvolatile memory device 500 may be configured to include the dynamic voltage supply circuit 300, the nonvolatile memory cell 410, the resistive load 420 and the sense amplifying circuit 430. The dynamic voltage supply circuit 300 may have the same configuration as described with reference to FIG. 13. The nonvolatile memory cell 410, the resistive load 420 and the sense amplifying circuit 430 may also have the same configurations as described with reference to FIGS. 15 and 16. Thus, the nonvolatile memory device 500 may be different from the nonvolatile memory device 400 illustrated in FIG. 15 in a feature that the dynamic supply voltage dVDD2 provided through a dynamic voltage supply line 550 is outputted from the dynamic voltage supply circuit 300. The dynamic voltage supply line 550 may be coupled to the sources of the fourth PMOS transistor MP44 constituting the resistive load 420 and the fifth PMOS transistor MP65 included in the sense amplifying circuit 430.

In the nonvolatile memory device 500 according to an embodiment, a "low" level period of the read signal READb may be synchronized with the "low" level periods of the second clock signal CK2 after the first "low" level period of the second clock signal CK2 elapses. In such a case, as described with reference to FIGS. 13 and 14, the dynamic supply voltage dVDD2 supplied through the dynamic voltage supply line 550 may have the double supply voltage "2×VDD". Thus, if the third PMOS transistor MP33 has the program state, the second PMOS transistor MP32 of the nonvolatile memory cell 410 and the fifth PMOS transistor MP65 of the sense amplifying circuit 430 have to be fully turned on during the read operation. According to the present embodiment, because the dynamic supply voltage dVDD2 having the double supply voltage "2×VDD" is applied to the second PMOS transistor MP32 of the nonvolatile memory cell 410 and the fifth PMOS transistor MP65 of the sense amplifying circuit 430, it may be possible to suppress the read disturbance phenomenon occurring due to a low supply voltage, which is less than a sum of a threshold voltage of the second PMOS transistor MP32 and a threshold voltage of the fifth PMOS transistor MP65 during the read operation.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A dynamic voltage supply circuit comprising:
   a voltage amplification/output circuit configured to receive a first clock signal and a second clock signal to generate a dynamic supply voltage greater than a supply voltage while the first clock signal has a low level; and
   a dynamic voltage output circuit configured to output the dynamic supply voltage while the first clock signal has a low level and configured to output a ground voltage while the first clock signal has a high level.

2. The dynamic voltage supply circuit of claim 1, wherein the voltage amplification/output circuit includes:
   a first capacitor coupled between a supply line of the first clock signal and a first node;
   a second capacitor coupled between a supply line of the second clock signal and a second node;
   a first NMOS transistor having a gate coupled to the second node, a drain coupled to a supply voltage terminal, and a source coupled to the first node; and
   a second NMOS transistor having a gate coupled to the first node, a drain coupled to the supply voltage terminal, and a source coupled to the second node.

3. The dynamic voltage supply circuit of claim 2, wherein high level periods of the first clock signal do not overlap with high level periods of the second clock signal.

4. The dynamic voltage supply circuit of claim 3, wherein a high level period of the first clock signal and a high level period of the second clock signal are alternately generated.

5. The dynamic voltage supply circuit of claim 2, wherein the dynamic voltage output circuit includes:
   a first PMOS transistor having a gate coupled to the supply line of the first clock signal, a drain coupled to an output line of the dynamic supply voltage, and a source coupled to the second node; and
   a third NMOS transistor having a gate coupled to the supply line of the first clock signal, a drain coupled to the output line of the dynamic supply voltage, and a source coupled to a ground voltage terminal.

6. The dynamic voltage supply circuit of claim 2, wherein the dynamic voltage output circuit includes:
   a first PMOS transistor having a gate coupled to the supply line of the second clock signal, a drain coupled to an output line of the dynamic supply voltage, and a source coupled to the first node; and
   a third NMOS transistor having a gate coupled to the supply line of the second clock signal, a drain coupled to the output line of the dynamic supply voltage, and a source coupled to a ground voltage terminal.

7. A nonvolatile memory device comprising:
   a dynamic voltage supply circuit configured to include a voltage amplification/output circuit and a dynamic voltage output circuit, wherein the voltage amplification/output circuit receives a first clock signal and a second clock signal to generate a dynamic supply voltage greater than a supply voltage while the first clock signal has a low level, and wherein the dynamic voltage output circuit outputs the dynamic supply voltage while the first clock signal has a low level and outputs a ground voltage while the first clock signal has a high level;
   a nonvolatile memory cell coupled between a bit line connected to a dynamic voltage supply line having the dynamic supply voltage and a ground voltage terminal; and
   a sense amplifying circuit configured to selectively output any one of the dynamic supply voltage and a ground voltage in response to a bit line voltage induced at the bit line.

8. The nonvolatile memory device of claim 7, wherein the voltage amplification/output circuit includes:
   a first capacitor coupled between a supply line of the first clock signal and a first node;
   a second capacitor coupled between a supply line of the second clock signal and a second node;
   a first NMOS transistor having a gate coupled to the second node, a drain coupled to a supply voltage terminal, and a source coupled to the first node; and a second NMOS transistor having a gate coupled to the first node, a drain coupled to the supply voltage terminal, and a source coupled to the second node.

9. The nonvolatile memory device of claim 8, wherein high level periods of the first clock signal do not overlap with high level periods of the second clock signal.

10. The nonvolatile memory device of claim 9, wherein a high level period of the first clock signal and a high level period of the second clock signal are alternately generated.

11. The nonvolatile memory device of claim 9, wherein the dynamic voltage output circuit includes:
   a first PMOS transistor having a gate coupled to the supply line of the first clock signal, a drain coupled to an output line of the dynamic supply voltage, and a source coupled to the second node; and
   a third NMOS transistor having a gate coupled to the supply line of the first clock signal, a drain coupled to the output line of the dynamic supply voltage, and a source coupled to a ground voltage terminal.

12. The nonvolatile memory device of claim 11, wherein a read operation of the nonvolatile memory cell is performed during low level periods of the first clock signal after a first low level period of the first clock signal elapses.

13. The nonvolatile memory device of claim 9, wherein the dynamic voltage output circuit includes:
   a first PMOS transistor having a gate coupled to the supply line of the second clock signal, a drain coupled to an output line of the dynamic supply voltage, and a source coupled to the first node; and
   a third NMOS transistor having a gate coupled to the supply line of the second clock signal, a drain coupled to the output line of the dynamic supply voltage, and a source coupled to a ground voltage terminal.

14. The nonvolatile memory device of claim 13, wherein a read operation of the nonvolatile memory cell is performed during low level periods of the second clock signal after a first low level period of the second clock signal elapses.

15. The nonvolatile memory device of claim 7,
   wherein the nonvolatile memory cell includes a second PMOS transistor and a third PMOS transistor;
   wherein the second PMOS transistor has a selection gate to which a selection signal is applied, a drain coupled to a source of the third PMOS transistor, and a source coupled to the bit line; and
   wherein the third PMOS transistor has a floating gate, a drain coupled to the ground voltage terminal, and the source coupled to the drain of the second PMOS transistor.

16. The nonvolatile memory device of claim 7, further comprising a resistive load coupled between the dynamic voltage supply line and the bit line.

17. The nonvolatile memory device of claim 16, wherein the resistive load includes a fourth PMOS transistor having a gate to which a read signal is applied, a drain coupled to the bit line, and a source coupled to the dynamic voltage supply line.

18. The nonvolatile memory device of claim 7, wherein the sense amplifying circuit includes:
   a fifth PMOS transistor having a gate coupled to the bit line, a drain coupled to a sensing output signal line, and a source coupled to the dynamic voltage supply line; and
   a fourth NMOS transistor having a gate coupled to the bit line, a drain coupled to the sensing output signal line, and a source coupled to the ground voltage terminal.

19. A dynamic voltage supply circuit comprising:
   a first terminal suitable for receiving a supply voltage;
   a second terminal suitable for receiving a first clock signal;
   a third terminal suitable for receiving a second clock signal;
   first and second output nodes;
   a first transistor coupled between the first terminal and the first output node;
   a second transistor coupled between the first terminal and the second output node;
   a first capacitor coupled between the first output node and the second terminal;
   a second capacitor coupled between the second output node and the third terminal; and
   a dynamic voltage output circuit coupled between a selected one of the first and second output nodes and a ground voltage terminal, suitable for generating a dynamic supply voltage greater than the supply voltage in response to a selected one of the first and second clock signals, the selected clock signal corresponding to an unselected one of the first and second output nodes.

20. The dynamic voltage supply circuit of claim 1, wherein dynamic voltage output circuit generates the dynamic supply voltage when the selected clock signal has a first level and generates a ground voltage when the selected clock signal has a second level.

\* \* \* \* \*